United States Patent
Matsumoto

(10) Patent No.: US 11,842,776 B2
(45) Date of Patent: Dec. 12, 2023

(54) MEMORY SYSTEM AND METHOD OF CONTROLLING POWER THEREIN

(71) Applicant: Kioxia Corporation, Tokyo (JP)

(72) Inventor: Hajime Matsumoto, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 17 days.

(21) Appl. No.: 17/550,092

(22) Filed: Dec. 14, 2021

(65) Prior Publication Data
US 2023/0067195 A1 Mar. 2, 2023

(30) Foreign Application Priority Data
Aug. 24, 2021 (JP) .................. 2021-136563

(51) Int. Cl.
*G11C 16/30* (2006.01)
*G11C 16/34* (2006.01)
*H03K 19/00* (2006.01)
*G11C 5/14* (2006.01)

(52) U.S. Cl.
CPC .......... *G11C 16/3404* (2013.01); *G11C 5/144* (2013.01); *G11C 16/30* (2013.01); *H03K 19/0016* (2013.01)

(58) Field of Classification Search
CPC ..... G11C 16/3404; G11C 5/144; G11C 16/30; H03K 19/0016
See application file for complete search history.

(56) References Cited

U.S. PATENT DOCUMENTS

| | | |
|---|---|---|
| 9,369,046 B2 | 6/2016 | Lee |
| 2015/0326123 A1 | 11/2015 | Fukushima et al. |
| 2018/0082728 A1 | 3/2018 | Thiruvengadam et al. |
| 2019/0212919 A1 | 7/2019 | Ryan et al. |
| 2021/0055866 A1 | 2/2021 | Fujimoto et al. |
| 2021/0064113 A1 | 3/2021 | Laurent et al. |
| 2022/0302838 A1* | 9/2022 | Eleftheriadis ......... H02M 3/156 |

FOREIGN PATENT DOCUMENTS

| | | |
|---|---|---|
| JP | 2007-251699 A | 9/2007 |
| JP | 6368535 B2 | 8/2018 |
| TW | 202117607 A | 5/2021 |

* cited by examiner

*Primary Examiner* — Jay W. Radke
(74) *Attorney, Agent, or Firm* — Foley & Lardner LLP

(57) ABSTRACT

A memory system in an embodiment includes: a nonvolatile memory; a memory controller configured to control the memory; and a power supply circuit configured to supply a voltage of power of at least one of the memory and the memory controller, wherein the power supply circuit is configured to: store first information having a value of the voltage to be supplied; output an output voltage based on the value of the voltage specified by the stored first information; detect an output current at an output end of the output voltage; compare a value of the detected output current with a threshold value; and update the stored first information to second information based on a result of the comparison, the second information having an updated value of the voltage to be supplied.

18 Claims, 2 Drawing Sheets

MEMORY SYSTEM AND METHOD OF CONTROLLING POWER THEREIN

CROSS REFERENCE TO RELATED APPLICATIONS

This application is based upon and claims the benefit of priority from Japanese Patent Application No. 2021-136563, filed on Aug. 24, 2021; the entire contents of which are incorporated herein by reference.

FIELD

Embodiments disclosed herein relate to a memory system and a method of controlling power in the memory system.

BACKGROUND

A memory system connectable to a host device is known. The memory system includes a power supply device to which power supply voltage is supplied from the host device or an external device. The power supply device generates a voltage of a value different from that of the power supply voltage, based on the supplied power supply voltage. The power supply device supplies the generated voltage to other devices included in the memory system as an output voltage. In the memory system, generally the output voltage is relatively low in value but a relatively high output current is generated. Because of the low value of the output voltage, an allowable variation range of the value of the output voltage becomes relatively narrow. Hence, the power supply device included in the memory system controls the value of the output voltage within the allowable variation range by using a DC/DC converter.

For example, in the memory system such as an SSD, a PMIC (Power Management IC) is sometimes used for reducing the cost and footprint. The PMIC can generate a plurality of output voltages having different voltage values respectively. Each of the values of the output voltages of the PMIC is designed to be a particular voltage at its output terminal. When a component of a power supply destination is located at a position far from the PMIC, the value of the voltage to be supplied to the component is possibly different from (lower than) the value of the output voltage at the output terminal of the PMIC. Therefore, there is a possibility that the power supply destination is not supplied with a desired voltage value.

DETAILED DESCRIPTION

An object of one embodiment is to provide a memory system and a control method capable of supplying a desired voltage value at a power supply destination. A memory system in the embodiment includes: a nonvolatile memory; a memory controller configured to control the memory; and a power supply circuit configured to supply a voltage of power of at least one of the memory and the memory controller, wherein the power supply circuit is configured to: store first information specifying to a value of the voltage to be supplied; output an output voltage based on the value of the voltage specified by the stored first information; detect an output current at an output node; compare a value of the detected output current with a threshold value; and update the stored first information to second information in which the value of the voltage to be supplied is updated based on a result of the comparison.

Figure 1:
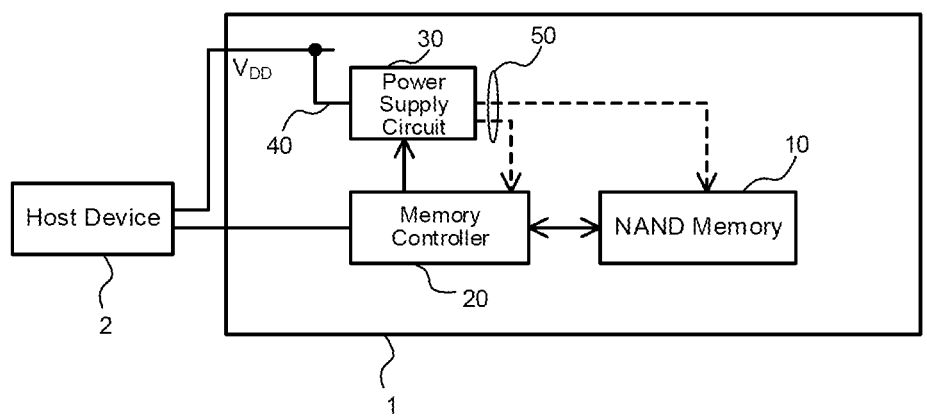
FIG. 1 is a block diagram illustrating a configuration of a memory system according to an embodiment connected to a host device.

(Configuration of an embodiment) FIG. 1 is a diagram illustrating a configuration of a memory system 1 according to an embodiment. As illustrated in FIG. 1, the memory system 1 is connectable to a host device 2. The memory system 1 is, for example, an SSD (Solid State Drive) or a UFS (Universal Flash Storage) device. The host device 2 is, for example, a server, a personal computer, an on-vehicle device, or a mobile-type information processing device. The memory system 1 functions as an external storage for the host device 2. The host device 2 can issue a request to the memory system 1. The request includes a read request and a write request.

The memory system 1 includes, for example, a NAND-type flash memory (hereinafter, referred also to as a NAND memory) 10, a memory controller 20, and a power supply circuit 30. Although not illustrated, the NAND memory 10 includes one or more memory chips. The memory chips include a plurality of memory cell transistors and can store data in a nonvolatile manner. The memory chips of the NAND memory 10 are connected to the memory controller 20.

The memory controller 20 performs program processing, read processing, and erase processing on the NAND memory 10. The memory controller 20 is, for example, a semiconductor circuit configured as an SoC (System-On-a-Chip). The memory controller 20 may be configured as an FPGA (Field-Programmable Gate Array) or an ASIC (Application Specific Integrated Circuit). The memory controller 20 may be composed of a plurality of chips. The functions of the memory controller 20 can be implemented by a CPU executing software (firmware), dedicated hardware, or a combination of them.

The power supply circuit 30 supplies power to circuit elements included in the memory system 1, such as the NAND memory 10 and the memory controller 20. Examples of the power supply circuit 30 include a PMIC (Power Management IC) and the like. The power supply circuit 30 receives supply of power VDD from the host device 2 or the external part of the memory system 1 via a power supply line 40, and generates one or more constant voltages. The power supply circuit 30 supplies the generated constant voltages to supply destinations such as the NAND memory 10 and the memory controller 20 via a supply line 50. In other words, the supply destinations of the constant voltages are loads on the power supply circuit 30. In the example illustrated in FIG. 1, the NAND memory 10 and the memory controller 20 are illustrated as the loads on the power supply circuit 30, but the loads are not limited to them. A circuit element such as a not-illustrated RAM connected to the external part of the memory controller 20 may also be a load on the power supply circuit 30.

As illustrated in FIG. 1, the supply line 50 from the power supply circuit 30 to the loads is not always arranged in the shortest distance from the power supply circuit 30. The supply line 50 is led to various loads while avoiding various circuit elements provided in the memory system 1.

Figure 2:
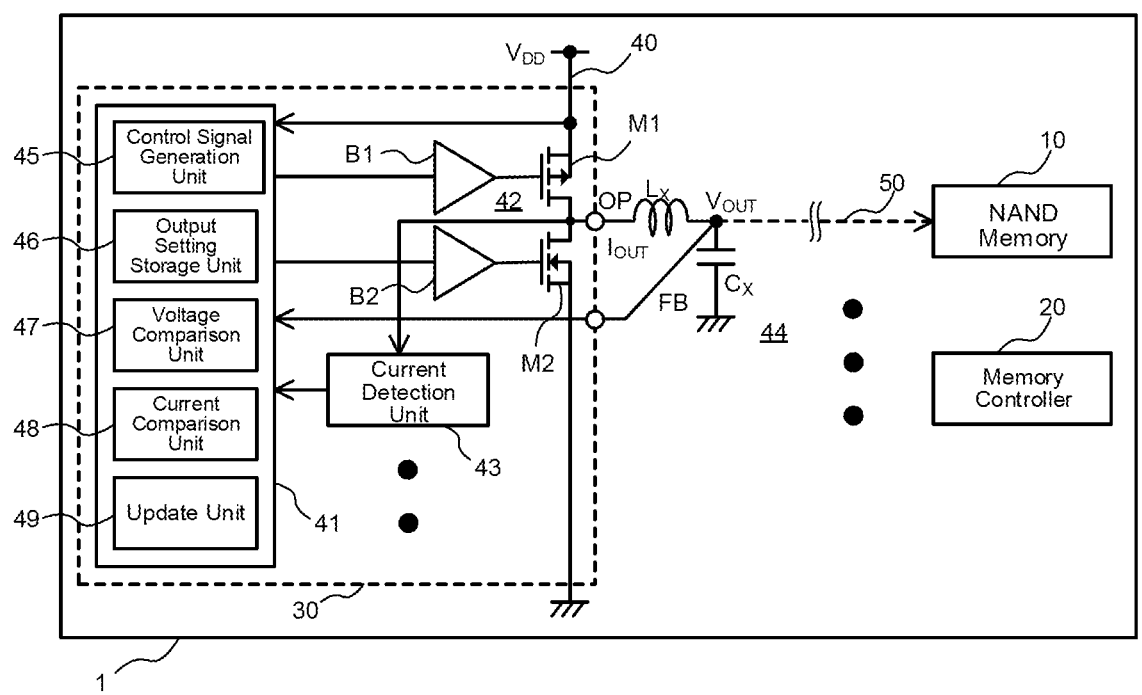
FIG. 2 is a block diagram illustrating a configuration example of a power supply device included in the memory system according to the embodiment.

FIG. 2 illustrates a configuration example of the power supply circuit 30 included in the memory system 1 according to the embodiment. As illustrated in FIG. 2, the power supply circuit 30 in the embodiment includes a control unit 41, a switching unit 42, and a current detection unit 43. The switching unit 42 and the current detection unit 43 constitute a part of a DC/DC converter in conjunction with an LC circuit 44 as an output circuit. The switching unit 42 has buffers B1 and B2 and switching elements M1 and M2. The LC circuit 44 has an inductor $L_X$ and a capacitor $C_X$. The current detection unit 43 detects a value of the current flowing from the switching unit 42. The current detection unit 43 outputs a detection result to the control unit 41.

The control unit 41 has a control signal generation unit 45, an output setting storage unit 46, a voltage comparison unit 47, a current comparison unit 48, and an update unit 49. The control signal generation unit 45 generates a control signal for controlling the switching unit 42. The output setting storage unit 46 stores setting information for setting an output voltage value of the power supply circuit 30. The output setting storage unit 46 can be implemented by a memory or register which can store the setting information. The stored setting information in the output setting storage unit 46 can be externally updated. The output setting storage unit 46 can store setting information for setting an initial value of the output voltage or setting information for setting the updated value of the output voltage. The voltage comparison unit 47 compares a value of a feedback voltage fed back from the LC circuit 44 with an output voltage value specified by the setting information stored in advance in the output setting storage unit 46. The control signal generation unit 45 generates a control signal for the switching unit 42 based on a comparison result by the voltage comparison unit 47. The current comparison unit 48 compares a detection result by the current detection unit 43 with a threshold value relating to the current. This threshold value may be stored in the output setting storage unit 46. The update unit 49 updates the setting information stored in the output setting storage unit 46 based on the comparison result by the current comparison unit 48.

The buffers B1 and B2 of the switching unit 42 amplify the control signal generated by the control signal generation unit 45. The switching elements M1 and M2 operate to on-off (on and off controlling) based on the control signal. Thus, the switching elements M1 and M2 generate a pulsed voltage according to the control signal. The switching element M1 has a source connected to the power VDD, a drain connected to a drain of the switching element M2, and a gate connected an output of the buffer B1. The switching element M2 has a source connected to wiring at the ground potential, a drain connected to the drain of the switching element M1, and a gate connected an output of the buffer B2. The voltage value of the power VDD is a power supply potential of the power supply circuit 30, and the ground potential is a reference potential of the power supply circuit 30. The drains of the switching elements M1 and M2 are connected to an output point OP of the power supply circuit 30. In other words, when the switching elements M1 and M2 are controlled to on-off based on the control signal of the control signal generation unit 45, the pulsed voltage is output on the drains of the switching elements M1 and M2 and the output point OP.

The inductor $L_X$ of the LC circuit 44 has one end connected to the output point OP of the power supply circuit 30 and the other end connected to the capacitor $C_X$. The capacitor $C_X$ is arranged between the other end of the inductor $L_X$ and the wiring at the ground potential. A connection point of the inductor $L_X$ and the capacitor $C_X$ is a node which outputs an output voltage $V_{out}$ of the power supply circuit 30. The pulsed voltage appearing at the drains of the switching elements M1 and M2 is input to the inductor $L_X$ via the output point OP, and the output voltage $V_{out}$ smoothed by the action of the LC circuit 44 is generated. The output voltage $V_{out}$ is supplied to a voltage supply point of the NAND memory 10 via the supply line 50. The voltage supply point of the NAND memory 10 is a terminal or node which is supplied with the power supply voltage of the NAND memory 10.

The connection point of the inductor LX and the capacitor CX is connected to the voltage comparison unit 47 of the control unit 41 of the power supply circuit 30 via a feedback line FB. In other words, the output voltage $V_{out}$ of the power supply circuit 30 is fed back to the voltage comparison unit 47 of the control unit 41. The voltage comparison unit 47 compares the value specified by the setting information stored in the output setting storage unit 46 with the value of the output voltage $V_{out}$ obtained via the feedback line FB. The control signal generation unit 45 controls to on-off of each of the switching elements M1 and M2 based on the comparison result by the voltage comparison unit 47. This is a constant voltage generation operation of the DC/DC converter, and a result of this, the output voltage $V_{out}$ is kept at a DC voltage at a fixed level.

As illustrated in FIG. 2, the LC circuit 44 has the inductor $L_X$ connected in series with the output point OP, and the capacitor $C_X$ connected between the inductor $L_X$ and the wiring at the ground potential. In other words, the LC circuit 44 also acts as a low-pass filter connected to the output point OP. This action cuts a high-frequency component of the output voltage $V_{out}$ and feeds it back to the voltage comparison unit 47 via the feedback line FB.

The current detection unit 43 detects an output current $I_{out}$ flowing from the output point OP of the power supply circuit 30 via the supply line 50. The current detection unit 43 monitors the state of the voltage or the current at any location of the switching unit 42 and thereby detects the output current $I_{out}$ flowing from the output point OP. In other words, the current detection unit 43 monitors the output current $I_{out}$ at the output point OP. The current detection unit 43 may continuously monitor the output current $I_{out}$ or may monitor the output current $I_{out}$ at a particular time interval. For example, the current detection unit 43 outputs a result obtained by averaging or integrating the detection results of the continuously monitored output current $I_{out}$, to the control unit 41 as a detection result. Further, for example, the current detection unit 43 outputs the detection result discretely obtained at the particular time interval to the control unit 41. As explained above, the current detection unit 43 feeds back the detection result with a high-frequency component of the detected output current $I_{out}$ cut, to the control unit 41 (concretely, the current comparison unit 48).

The current comparison unit 48 compares the detection result by the current detection unit 43 with a threshold value relating to the output current $I_{out}$. The update unit 49 updates the setting information in the output setting storage unit 46 based on the comparison result by the current comparison unit 48.

The power supply circuit 30 may generate a plurality of different voltages. In this case, the power supply circuit 30 only needs to include a plurality of DC/DC converters each including at least the switching unit 42, current detection unit 43, and LC circuit 44. For example, the power supply circuit 30 may generate an output voltage which has a value different from that of the output voltage to be supplied to the NAND memory 10 and which is to be supplied to the memory controller 20. Besides, the LC circuit 44 may be implemented in a form of being included in the power supply circuit 30.

(Action of current detection) The power supply circuit 30 included in the memory system 1 of the embodiment has a control loop of feeding back the output voltage $V_{out}$ and comparing the output voltage $V_{out}$ with the setting information relating to the output voltage, and a control loop of detecting and feeding back the output current $I_{out}$ and comparing the output current $I_{out}$ with the threshold value relating to the output current $I_{out}$. The control loop of feeding back the output voltage $V_{out}$ is a constant voltage generation operation as the DC/DC converter. On the other hand, the control loop of feeding back the output current $I_{out}$ is an operation of correcting the output voltage $V_{out}$ so that the voltage at the voltage supply point in the load becomes a desired value.

Generally, the constant voltage generation operation of the DC/DC converter feeds back the output voltage of a power supply device. However, in a power supply device which outputs a relatively low voltage and large current by a single element such as the PMIC used in the memory system, an electrical resistance of the supply line from the power supply device to the load needs to be taken into consideration. More specifically, even if the output voltage of the power supply device has a desire value, the voltage at the voltage supply point in the load possibly becomes below the desired value due to a voltage drop on the supply line. When the voltage to be supplied to the load (namely, the power supply voltage of the circuit serving as the load) becomes lower as above, the load does not operate normally or with a desired accuracy in some cases. This cannot be avoided even by feedback controlling the output voltage of the LC circuit of the output of the DC/DC converter.

The power supply circuit 30 of the embodiment includes the current detection unit 43 and thereby detects the output current $I_{out}$ of the power supply circuit 30 (concretely, the switching unit 42). As the output current $I_{out}$ becomes larger, a voltage drop proportional to the resistance value of the supply line 50 occurs. Hence, the power supply circuit 30 of the embodiment changes the voltage value of the output voltage $V_{out}$ according to the magnitude of the output current $I_{out}$. This enables control of the output voltage $V_{out}$ from which the influence of the voltage drop in the supply line 50 is eliminated, thereby obtaining the desired voltage at the voltage supply point in the load.

Figure 3:
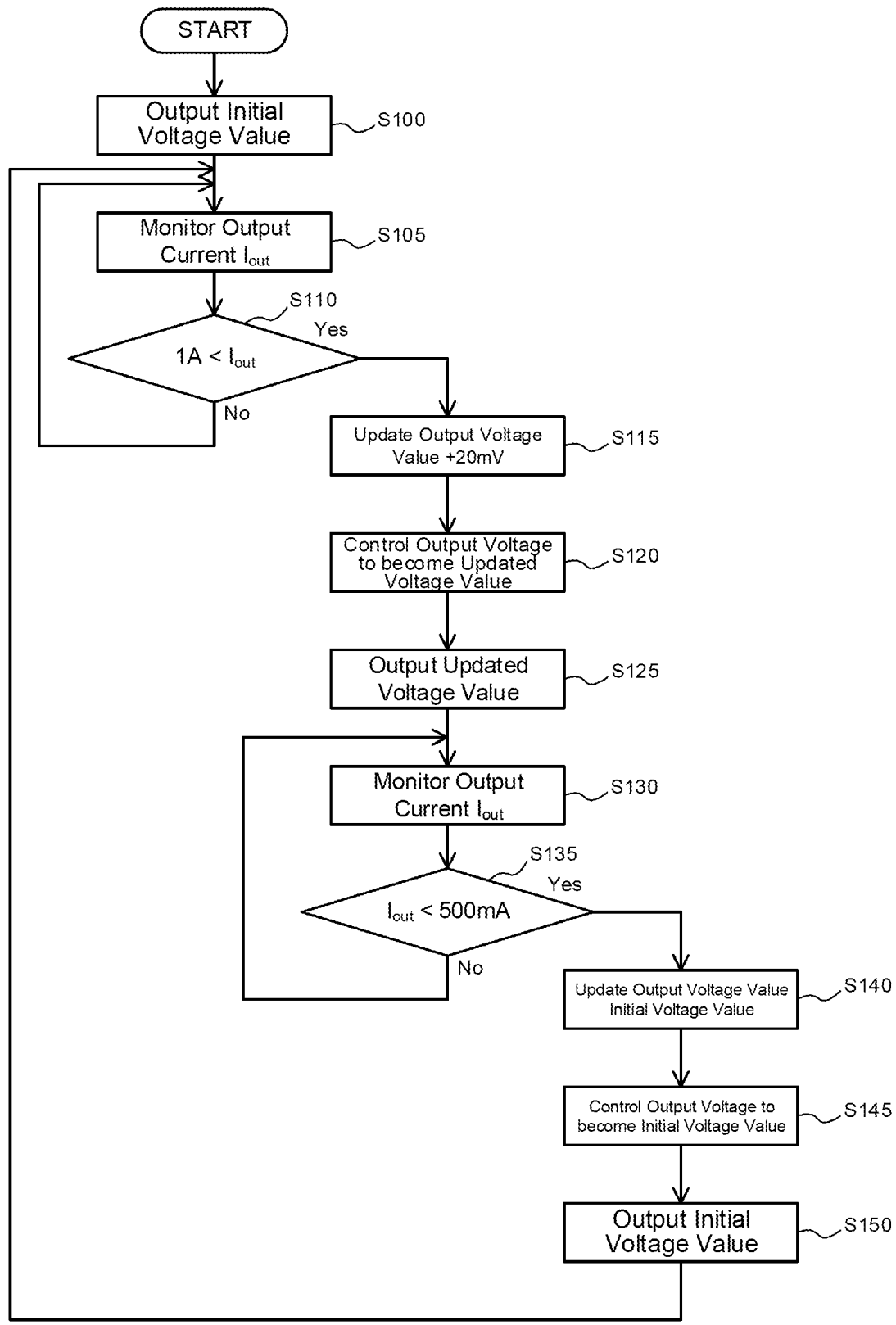
FIG. 3 is a flowchart illustrating a control method of the power supply device included in the memory system according to the embodiment.

(Operation of the embodiment) The operation of the power supply circuit 30 of the memory system 1 in the embodiment will be explained referring to FIG. 2 and FIG. 3. The power supply circuit 30 generates the output voltage $V_{out}$, based on the setting information for setting the initial value of the output voltage, and outputs the generated output voltage $V_{out}$. In the following explanation, the initial value of the output voltage is called an initial voltage value. Further, the setting information for setting the initial voltage value is called initial setting. Concretely, the control signal generation unit 45 reads the initial setting from the output setting storage unit 46, and generates the control signal for the switching elements M1 and M2. The switching elements M1 and M2 perform on-off controlling, based on the control signal. The voltage appearing at the output point OP is smoothed by the inductor $L_X$ and the capacitor $C_X$, whereby the output voltage $V_{out}$ is generated. The output voltage $V_{out}$ is fed back to the voltage comparison unit 47 via the feedback line FB. The voltage comparison unit 47 compares the initial voltage value specified from the initial setting stored in the output setting storage unit 46 with the fed back output voltage $V_{out}$. The control signal generation unit 45 changes the control signal so that the output voltage $V_{out}$ becomes initial voltage value, based on the comparison result by the voltage comparison unit 47. At this stage, the output voltage $V_{out}$ is stabilized at the initial voltage value (S100).

The current detection unit 43 is monitoring the output current $I_{out}$ at the output point OP (S105). The current detection unit 43 sends the output current $I_{out}$ detected by the monitoring, to the current comparison unit 48.

The current comparison unit 48 compares the current value of the output current $I_{out}$ with a threshold value relating to the upper limit of the output current $I_{out}$ (hereinafter, referred to as an upper limit threshold value) (S110). The upper limit threshold value is assumed here to be 1 A. The upper limit threshold value is decided from the current value from which the supply voltage to the load is estimated to be low due to the occurrence of a voltage drop on the supply line 50. When the output current $I_{out}$ does not exceed the upper limit threshold value (No at S110), the current detection unit 43 continues the monitoring of the output current $I_{out}$ (S105).

When the output current $I_{out}$ exceeds the upper limit threshold value (Yes at S110), the update unit 49 updates the initial setting stored in the output setting storage unit 46 with the setting information for setting the output voltage value obtained by increasing the initial voltage value by a certain voltage (for example, 200 mV) (S115). This is because in a state where the output current $I_{out}$ exceeds the upper limit threshold value, the voltage drop on the supply line 50 is too large and, as a result, the state can be regarded as a state where the supply voltage to the load decreases to be lower than the desired voltage value (for example, the initial voltage value). In the following explanation, the output voltage value obtained by increasing the initial voltage value by a certain voltage is called an updated voltage value. Further, the setting information for specifying the updated voltage value is called an updated setting.

The voltage comparison unit 47 compares the updated voltage value with the output voltage $V_{out}$. The control signal generation unit 45 controls the output voltage $V_{out}$ generated by the switching unit 42 to become the updated voltage value, based on the comparison result by the voltage comparison unit 47. Here, the value of the output voltage $V_{out}$ is controlled to increase (S120). In this event, the control signal generation unit 45 controls the control signal such that the change of the output voltage $V_{out}$ does not become steep. More specifically, the control signal generation unit 45 generates the control signal such that the output voltage $V_{out}$ changes at a relatively low slew rate. This is for suppressing an adverse effect on the load due to the rapid variation in the output voltage $V_{out}$.

As the result of the control loop of the voltage comparison unit 47, the control signal generation unit 45, the switching unit 42, the LC circuit 44, and the feedback line FB, the output voltage $V_{out}$ is stabilized to the newly set updated voltage value (S125). The control of S115 to S125, the output voltage $V_{out}$ becomes the updated voltage value higher than the initial voltage value, and the supply voltage to the load is corrected (increased). In this event, the current detection unit 43 is monitoring the output current $I_{out}$ (S130).

The current comparison unit 48 compares the current value of the output current $I_{out}$ with a threshold value relating to the lower limit of the output current $I_{out}$ (hereinafter, referred to as a lower limit threshold value) (S135). The lower limit threshold value is assumed here to be 500 mA. The lower limit threshold value is decided from the current value from which the supply voltage to the load is estimated to be too high due to the occurrence of the voltage drop on the supply line 50. When the output current $I_{out}$ is not below the lower limit threshold value (No at S130), the current detection unit 43 continues the monitoring of the output current $I_{out}$ (S130).

When the output current $I_{out}$ is below the lower limit threshold value (Yes at S135), the update unit 49 updates the updated setting stored in the output setting storage unit 46, for example, with the initial setting (S140). This is because in a state where the output current $I_{out}$ is below the lower limit threshold value, the voltage drop on the supply line 50 becomes small and, as a result, the state can be regarded as a state where the supply voltage to the load is close to the desired voltage value (for example, the initial voltage value).

The voltage comparison unit 47 compares the initial voltage value with the output voltage $V_{out}$. The control signal generation unit 45 controls the output voltage $V_{out}$ generated by the switching unit 42 to become the initial voltage value, based on the comparison result of the voltage comparison unit 47. Thus, the value of the output voltage $V_{out}$ is controlled to decrease (S145). In this event, the control signal generation unit 45 controls the control signal such that the change in the output voltage $V_{out}$ does not become steep. Similarly to S120, the control signal generation unit 45 generates the control signal such that the output voltage $V_{out}$ changes at a relatively low slew through rate. This is for suppressing an adverse effect on the load due to the rapid variation in the output voltage $V_{out}$.

As the result of the control loop of the voltage comparison unit 47, the control signal generation unit 45, the switching unit 42, the LC circuit 44, and the feedback line FB, the output voltage $V_{out}$ is stabilized to the newly set initial voltage value (S150). The control of S140 to S150, the output voltage $V_{out}$ becomes the initial voltage value, and the supply voltage to the load is corrected (decreased). Also after this, the current detection unit 43 continues monitoring the output current $I_{out}$ (S105).

As explained above, the power supply circuit 30 of the memory system 1 in the embodiment monitors the output current $I_{out}$ and compares it with the threshold values to perform a control so that the supply voltage to the load becomes the desired supply voltage value. Accordingly, even when the line length of the supply line 50 from the power supply circuit 30 to the load is long or large, the influence due to the voltage drop occurring on the supply line can be suppressed to stabilize the supply voltage to the load to an appropriate value. Further, the power supply circuit 30, when realized by the PMIC, enhances the degree of freedom of the component arrangement on a substrate and also contributes to cost reduction.

Further, according to the power supply circuit 30 of the memory system 1 in the embodiment, two threshold values (upper limit threshold value and lower limit threshold value) to be compared with the output current $I_{out}$ are provided to set the threshold value for increasing the value of the output voltage $V_{out}$ and the threshold value for decreasing (initializing) the value of the output voltage $V_{out}$ to different values. In other words, the control of the output voltage $V_{out}$ to the change in the output current $I_{out}$ is given hysteresis. Thus can suppress the variation in the supply voltage to the load (NAND memory 10), even when the load is, for example, the NAND memory 10 in which the output current relatively largely varies between read and write. In short, the operation of the above power supply circuit 30 contributes to stabilization of the operation of the memory system 1.

Further, according to the power supply circuit 30 of the memory system 1 in the embodiment, the control signal generation unit 45 controls the control signal such that the change in the output voltage $V_{out}$ does not become steep. By shifting the change in the output voltage as above, the influence exerted on the load can be minimized.

Note that the memory system 1 in the embodiment is explained as above for the example of one kind of the output voltage $V_{out}$, but not limited to this. The memory system 1 is also applicable to the case where the NAND memory 10, the memory controller 20, the RAM (not illustrated) and the like require the supply of the power supply voltages of different values.

Further, the output voltage $V_{out}$ is corrected by the combination of one upper limit threshold value and one lower limit threshold value in the above embodiment, but not limited to this. The output voltage correction at a plurality of stages may be performed by combining a plurality of upper limit threshold values and a plurality of lower limit threshold values. Furthermore, when the output current $I_{out}$ exceeds the upper limit threshold value, the value of the output voltage $V_{out}$ is increased up to the updated voltage value, and when the output current $I_{out}$ is below the lower limit threshold value, the value of the output voltage $V_{out}$ is set to the initial voltage value in the above embodiment, but not limited to this. When the output current $I_{out}$ is below the lower limit threshold value, the value of the output voltage $V_{out}$ may be controlled to be decreased by a predetermined amount.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory;
    a memory controller configured to control the memory; and
    a power supply circuit configured to supply a voltage of power to at least one of the memory and the memory controller, wherein
    the power supply circuit is configured to:
        store first information specifying a value of the voltage to be supplied;
        output an output voltage at an output node based on the value of the voltage specified by the stored first information;
        detect an output current at the output node;
        compare a value of the detected output current with a threshold value; and
        update the stored first information to second information based on a result of the comparison, the second information specifying an updated value of the voltage to be supplied.

2. The memory system according to claim 1, wherein:
    the threshold value includes a first threshold value indicating an upper limit and a second threshold value indicating a lower limit; and the power supply circuit is further configured to:
increase the value of the voltage when the value of the output current exceeds the first threshold value as a result of the comparison; and
decrease the value of the voltage when the value of the output current is below the second threshold value as a result of the comparison.

3. The memory system according to claim 2, wherein the power supply circuit is further configured to change the output voltage at a predetermined slew rate when the first information is updated to the second information.

4. The memory system according to claim 2, wherein the power supply circuit comprises:
a first circuit configured to generate a pulse voltage by on and off controlling a pair of switching elements; and
a second circuit configured to generate the output voltage by smoothing the pulse voltage generated by the first circuit.

5. The memory system according to claim 1, wherein the power supply circuit is further configured to change the output voltage at a predetermined slew rate when the first information is updated to the second information.

6. The memory system according to claim 5, wherein the power supply circuit comprises:
a first circuit configured to generate a pulse voltage by on and off controlling a pair of switching elements; and
a second circuit configured to generate the output voltage by smoothing the pulse voltage generated by the first circuit.

7. The memory system according to claim 1, wherein the power supply circuit comprises:
a first circuit configured to generate a pulse voltage by on and off controlling a pair of switching elements; and
a second circuit configured to generate the output voltage by smoothing the pulse voltage generated by the first circuit.

8. The memory system according to claim 7, wherein the power supply circuit is further configured to control the first circuit based on the value of the first information and on the value of the output voltage.

9. The memory system according to claim 1, wherein:
the first information includes third information specifying a value of a first voltage to be supplied as power of the memory and fourth information specifying a value of a second voltage to be supplied as power to the memory controller; and
the power supply circuit is further configured to:
output a first output voltage at a first output node based on the value of the first voltage specified by the third information;
detect a first output current at the first output node;
compare a value of the detected first output current with a first threshold value;
update the third information to fifth information based on a result of the comparison between the value of the first output current and the first threshold value, the fifth information having an updated value of the first voltage;
output a second output voltage at a second output node based on the value of the second voltage specified by the fourth information;
detect a second output current at the second output node;
compare a value of the detected second output current with a second threshold value; and
update the fourth information to sixth information based on a result of the comparison between the value of the second output current and the second threshold value, the sixth information having an updated value of the second voltage.

10. A method of controlling power in a memory system comprising a nonvolatile memory, a memory controller configured to control the memory, and a power supply circuit configured to supply a voltage of power to at least one of the memory and the memory controller, the control method comprising:
storing first information specifying a value of the voltage to be supplied;
outputting an output voltage at an output node based on the value of the voltage specified by the stored first information;
detecting an output current at the output node;
comparing a value of the detected output current with a threshold value; and
updating the stored first information to second information based on a result of the comparison, the second information specifying an updated value of the voltage to be supplied.

11. The method according to claim 10, wherein the threshold value includes a first threshold value indicating an upper limit and a second threshold value indicating a lower limit,
the method further comprising:
increasing the value of the voltage when the value of the output current exceeds the first threshold value as a result of the comparison; and
decreasing the value of the voltage when the value of the output current is below the second threshold value as a result of the comparison.

12. The method according to claim 11, further comprising changing the output voltage at a predetermined slew rate when the first information is updated to the second information.

13. The method according to claim 11, wherein the power supply circuit comprises:
a first circuit configured to generate a pulse voltage by on and off controlling a pair of switching elements; and
a second circuit configured to generate the output voltage by smoothing the pulse voltage generated by the first circuit.

14. The method according to claim 10, further comprising changing the output voltage at a predetermined slew rate when the first information is updated to the second information.

15. The method according to claim 14, wherein the power supply circuit comprises:
a first circuit configured to generate a pulse voltage by on and off controlling a pair of switching elements; and
a second circuit configured to generate the output voltage by smoothing the pulse voltage generated by the first circuit.

16. The method according to claim 10, wherein the power supply circuit comprises:
a first circuit configured to generate a pulse voltage by on and off controlling a pair of switching elements; and
a second circuit configured to generate the output voltage by smoothing the pulse voltage generated by the first circuit.

17. The method according to claim 16, further comprising controlling the first circuit based on the stored value of the voltage and on the value of the output voltage.

18. The method according to claim 10, wherein the first information includes third information specifying a value of a first voltage to be supplied as power of the memory and fourth information specifying a value of a second voltage to be supplied as power of the memory controller, the method further comprising:
outputting a first output voltage at a first output node based on the value of the first voltage specified by the third information;
detecting a first output current at the first output node;
comparing a value of the detected first output current with a first threshold value;
updating the third information to fifth information based on a result of the comparison between the value of the first output current and the first threshold value, the fifth information specifying an updated value of the first voltage;
outputting a second output voltage at a second output node based on the value of the second voltage specified by the fourth information;
detecting a second output current at the second output node;
comparing a value of the detected second output current with a second threshold value; and
updating the fourth information to sixth information based on a result of the comparison between the value of the second output current and the second threshold value, the sixth information specifying an updated value of the second voltage.

* * * * *